US007671391B2

(12) United States Patent
Kawahito

(10) Patent No.: US 7,671,391 B2
(45) Date of Patent: Mar. 2, 2010

(54) TIME-OF-LIGHT FLIGHT TYPE DISTANCE SENSOR

(75) Inventor: Shoji Kawahito, Hamamatsu (JP)

(73) Assignee: National University Corporation Shizuoka University, Shizuoka-shi (JP)

(*) Notice: Subject to any disclaimer, the term of this patent is extended or adjusted under 35 U.S.C. 154(b) by 30 days.

(21) Appl. No.: 10/589,722

(22) PCT Filed: Feb. 14, 2005

(86) PCT No.: PCT/JP2005/002662

§ 371 (c)(1),
(2), (4) Date: Aug. 17, 2006

(87) PCT Pub. No.: WO2005/078386

PCT Pub. Date: Aug. 25, 2005

(65) Prior Publication Data

US 2007/0158770 A1  Jul. 12, 2007

(30) Foreign Application Priority Data

Feb. 18, 2004  (JP)  ............................. 2004-041057

(51) Int. Cl.
*H01L 31/062* (2006.01)
(52) U.S. Cl. ............... 257/290; 257/448; 257/E31.085; 257/E31.124
(58) Field of Classification Search ................. 257/290, 257/448, 454, E31.085, E31.124
See application file for complete search history.

(56) References Cited

U.S. PATENT DOCUMENTS

| 4,136,292 | A  | * | 1/1979  | Suzuki et al. ................ 327/52 |
| 6,323,942 | B1 |   | 11/2001 | Bamji |
| 6,396,570 | B2 | * | 5/2002  | Takayanagi et al. ........ 356/5.01 |
| 6,548,352 | B1 | * | 4/2003  | Rhodes ........................ 438/257 |
| 6,777,659 | B1 | * | 8/2004  | Schwarte .................. 250/208.1 |

FOREIGN PATENT DOCUMENTS

JP          7 142761          6/1995

(Continued)

OTHER PUBLICATIONS

Bellutti et al, Microelectronics Reliability 39 (1999) 181-185.*
U.S. Appl. No. 12/065,156, filed Feb. 28, 2008, Kawahito, et al.
U.S. Appl. No. 12/065,158, filed Feb. 28, 2008, Kawahito, et al.
Robert Lange et al., "Demodulation Pixels in CCD and CMOS Technologies for Time-of-Flight Ranging", Proceedings of SPIE, vol. 3965, pp. 177-188, 2000.
Ryohei Miyagawa et al., "CCD-Based Range-Finding Sensor", IEEE Transactions on Electron Devices, vol. 44, No. 10, pp. 1648-1652, 1997.

*Primary Examiner*—Allan R. Wilson
(74) *Attorney, Agent, or Firm*—Oblon, Spivak, McClelland, Maier & Neustadt, L.L.P.

(57) ABSTRACT

A lower cost range-finding image sensor based upon measurement of reflection time of light with reduced fabrication processes compared to standard CMOS manufacturing procedures. An oxide film is formed on a silicon substrate, and two photo-gate electrodes for charge-transfer are provided on the oxide film. Floating diffusion layers for taking charges out from a photodetector layer are provided at the ends of the oxide film, and on the outside thereof are provided a gate electrode for resetting and a diffusion layer for providing a reset voltage.

11 Claims, 14 Drawing Sheets

FOREIGN PATENT DOCUMENTS

| | | |
|---|---|---|
| JP | 2000 517427 | 12/2000 |
| JP | 2001 194458 | 7/2001 |
| JP | 2001 268445 | 9/2001 |
| JP | 2001 281336 | 10/2001 |
| JP | 2002 368205 | 12/2002 |
| JP | 2003 51988 | 2/2003 |
| JP | 2003 247809 | 9/2003 |
| JP | 2004 32682 | 1/2004 |
| JP | 2004 45304 | 2/2004 |
| JP | 2004 294420 | 10/2004 |
| WO | 02 49339 | 6/2002 |

\* cited by examiner (a)

(b)

US 7,671,391 B2

TIME-OF-LIGHT FLIGHT TYPE DISTANCE SENSOR

FIELD OF THE INVENTION

The present invention relates to a range-finding sensor, which measures a delay time of a light pulse transmitted from a light source and then reflected by a target object to be measured.

BACKGROUND-ART

The following references show related arts:
(1) Inventor: Cyrus Bamji, Assignee: Canesta Inc., "CMOS-Compatible Three-dimensional image sensor", U.S. Pat. No. 6,323,942 B1, Nov. 27, 2001;
(2) R. Lange, P. Seitz, A. Biber, and S. Lauxtermann, "Demodulation pixels in CCD and CMOS technologies for time-of-flight ranging", Proceedings of SPIE, Vol. 3965, pp. 177-188, 2000;
(3) Ryohei Miyagawa, Takeo Kanade, "CCD-based range-finding sensor", IEEE Trans. Electron Devices, vol. 44, No. 10, pp. 1648-1652 (1997);
(4) Range Imaging Device, Japanese Patent Application Laid-open No. 2001-281336; and
(5) Charge Coupled Device, Japanese Patent Application Laid-open No. 2003-51988.

According to the method of (1), light pulses are transmitted, and the waveform of received signal pulses is shaped, by detecting peaks of the received signal pulses so that a delay time can be digitally measured using high-speed pulses. Since the method of (1) cannot work well without a sufficient light intensity that facilitates generation of a pulse signal from the received signal, application fields of method of (1) are limited.

The architectures of the methods of (2) and (3) are similar to each other. In the method of (2), in which CCD and CMOS are merged into a single chip through an integrated fabrication process, with a high frequency modulated light of 20 MHz, by utilizing a charge transfer mechanism of the CCD, a characteristic such that the distribution ratio of charges into two nodes depends on the delay time of the modulated light, in synchronization with the modulated light, is utilized. Such integrated CCD-CMOS manufacturing procedure increases cost.

According to the method of (3), the structure of the CCD is utilized to alternately transfer charges, which are generated by a pulse-modulated light, to two nodes, and a characteristic of the resulting charge distribution ratio depending on the delay time of the modulated light is utilized. Use of such a CCD requires a special fabrication process. Furthermore, while only a one-dimensional sensor (i.e., line sensor) is disclosed, implementation of a two-dimensional sensor (area sensor) established only with CCDs may be difficult, considering that all of the pixels should be simultaneously driven at a high frequency.

According to the methods of (4) and (5), though no detailed structure is disclosed, a structure in which charges generated by a photodiode are transferred to floating diffusion layers via two transfer gates is employed. However, incomplete transfer of the charges to two floating diffusion layers results in an insufficient performance. Therefore, a complex fabrication process must be added to fabricate a CMOS structure, resulting in a high fabrication cost. Meanwhile, because integration of a parallel-driving circuit for driving pixels is impossible in the CCD architecture by itself, an integrated CCD/CMOS manufacturing procedure is required for the CCD architecture. In conclusion, low cost does not go with high performance.

SUMMARY OF THE INVENTION

It is preferable to manufacture a range-finding sensor with a maximum performance at low cost, by adding the least possible number of fabrication processes to a standard CMOS manufacturing procedure.

An object of the present invention is to provide a high performance range-finding sensor, being manufactured by a standard CMOS manufacturing procedure or by adding a simple fabrication process to the standard CMOS manufacturing procedure.

BRIEF DESCRIPTION OF THE DRAWINGS

—FIG. 7(a) is a cross-sectional view, while
FIG. 7(b) is a top view—in comparison with FIG. 1.

DETAILED DESCRIPTION OF THE INVENTION

First Embodiment

Complete transfer of charges is required to provide a time-of-flight (hereafter, called 'TOF') sensor. However, it has been considered impossible to achieve such complete transfer using a standard CMOS architecture. Accordingly, some fabrication processes have been added to the standard CMOS manufacturing procedure. The present invention is to overcome such a problem by using a micro-fabrication technology and a special structure that can be fabricated using standard CMOS manufacturing procedure.

Figure 1:
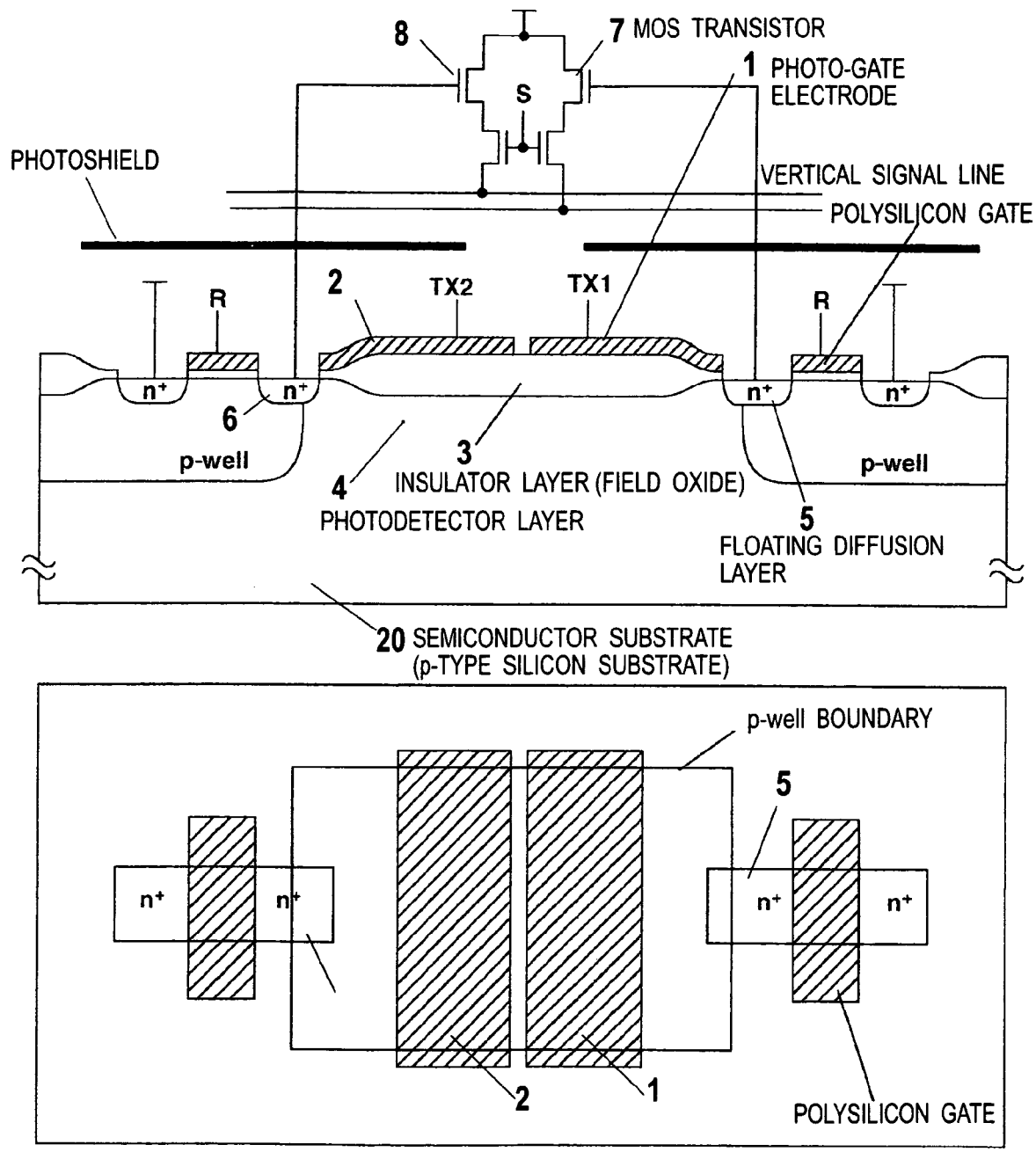
FIG. 1 shows a structure of a pixel area in a TOF sensor.
Figure 2:
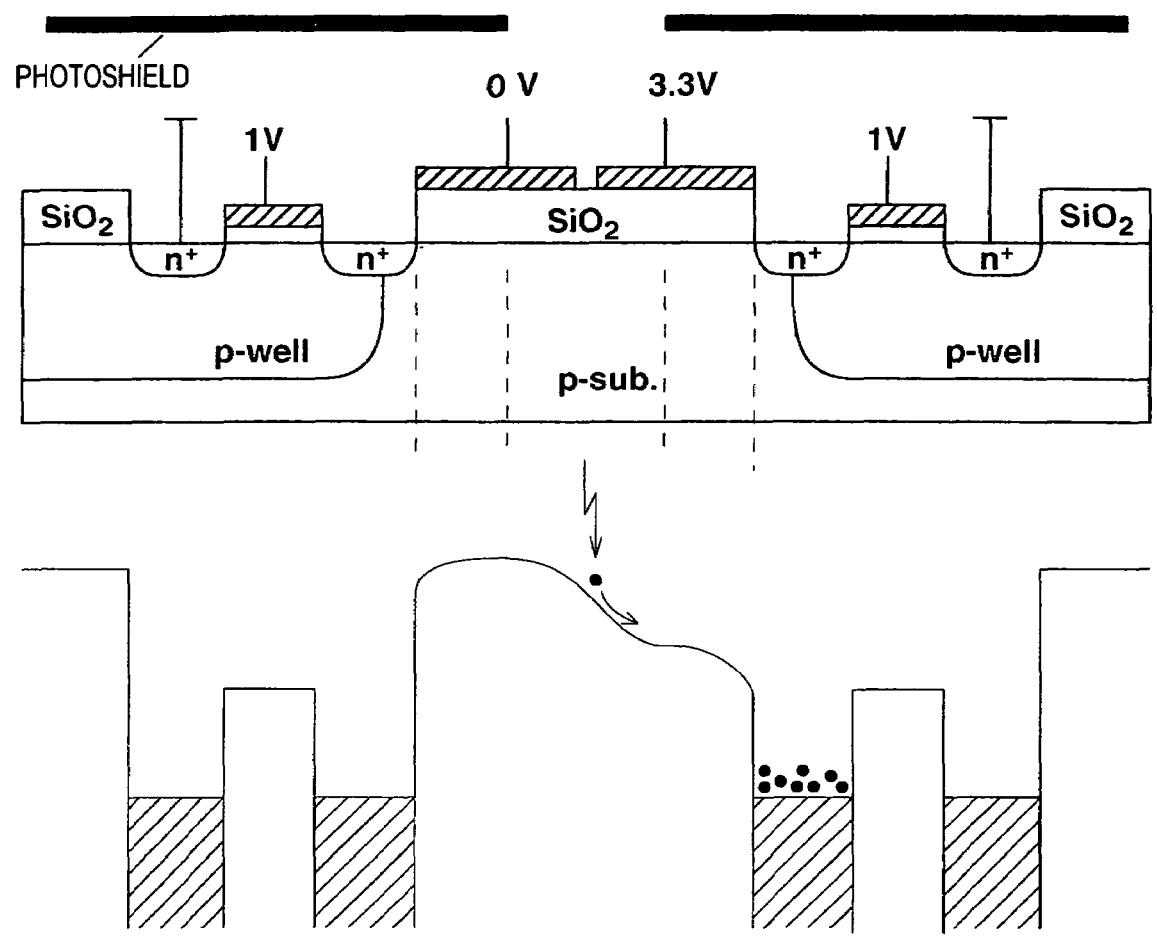
FIG. 2 is a potential distribution diagram explaining an operation of the TOF sensor.

FIG. 1 shows a structure of a pixel of a range-finding sensor according to the present invention. While a single pixel may be used by itself for a certain application field, arranging a plurality of pixels one-dimensionally or two-dimensionally implements a range-finding sensor. FIG. 1(a) shows a cross-sectional view of the pixel of the range-finding sensor while FIG. 1(b) shows a plan view observed from above a surface of a semiconductor substrate—observed from a location in the upper direction on the paper of the cross-sectional view. FIG. 2 shows a potential distribution in and at the surface of the semiconductor substrate, describing the behavior of the pixel of the range-finding sensor.

An insulator layer (3) is provided on the semiconductor substrate (20), and a couple of photo-gate electrodes (1 and 2) configured to transfer charges are provided on the photo-gate electrodes. At the ends of the insulator layer, floating diffusion layers (5 and 6) configured to extract charges from a photodetector layer (4) are provided, and at the outsides of the floating diffusion layers, gate electrodes for reset transistors and diffusion layers configured to supply reset-voltages to the floating diffusion layers through the reset transistors are provided. Hereinafter, an exemplary structure encompassing a p-type silicon substrate as the semiconductor substrate (20), a field oxide as the insulator layer (3), and polysilicon electrodes as respective photo-gate electrodes (1 and 2) will be explained.

As shown in FIG. 1, on the field oxide are provided two polysilicon electrodes as close as possible to each other. Repetitive signal pulses TX1 and TX2 having reverse phases to each other are applied to the polysilicon electrodes, thereby operating the pixel. It is assumed that the polysilicon electrodes be thin enough for a received light with a specific wavelength to pass through. Note that a compound called "silicide" made of metal and silicon is formed on the polysilicon electrodes, and if the silicide does not have enough transmissivity for a received light to pass through, a process for preventing formation of the silicide or removing the silicide thereafter is needed. Furthermore, note that FIG. 1 is based on the assumption that a local oxidation of silicon (LOCOS) process is used for forming the field oxide. Illustration of the geometry of the LOCOS configuration is omitted in FIG. 2, because FIG. 2 is supposed to explain the operation principle of the pixel.

An aperture is provided only at the central region between two respective polysilicon electrodes so that the other regions can be optically shielded. It is preferable that the semiconductor layer beneath the polysilicon electrodes be of a low concentration so that the strongest possible fringing electric field can be established in the semiconductor layer. Such low concentration region can be achieved by a manufacturing procedure such that the formation process of p-type well is omitted against the standard manufacturing procedure, by which a p-type well and an n-type well is formed in a low concentration p-type substrate so as to implement a CMOS device. While, in general, channel-stop impurities may be introduced in the semiconductor layer below the field oxide so as to prevent the formation of inversion layer at the surface of the semiconductor layer, the introduction of the channel-stop impurities should be prevented in the semiconductor layer. The prevention of the introduction of the channel-stop impurities may be achieved by changing the mask pattern used in the standard CMOS manufacturing procedure; otherwise, an addition of a new mask and a new fabrication process are needed.

With such a structure, an exemplary potential distribution when applying 0V and 3.3V, for example, to the TX2 and the TX1, respectively, is shown in FIG. 2. In this case, almost all of the charges generated by the light coming from the aperture enter the floating diffusion layer (n$^+$ region) on the right side. This emanates from the potential distribution in FIG. 2, which is generated by applying such voltages to the respective gates, and an acceleration force towards the right side, which is established by the fringing electric field ascribable to the potential distribution. Note that the voltages shown in FIG. 2 are mere examples and the present invention is not limited the examples shown in FIG. 2.

Since the field oxide is relatively thick, the electric field applied to the semiconductor surface will become relatively weaker and the fringing electric field is accordingly expected to increment against the decrement of the electric field at the semiconductor surface. Therefore, a scheme for preventing development of a potential hill at the gap between two polysilicon electrodes is required.

When n-type impurity atoms have been introduced into polysilicon gates that serve as the photo-gate electrodes, the work function for the semiconductor substrate differs from that for the photo-gate electrode side. Thus, when a high positive voltage (e.g., 3.3V) and 0V are applied to the TX1 and the TX2, respectively, a certain size of a gap between two photo-gate electrodes may develop a potential hill in the gap, preventing the charges in the TX2 side from moving to the TX1 side. In such a case, the potential hill can be removed by applying a negative voltage (e.g., −1V) to the TX2. Application of such a negative voltage to the TX2 side relative to the substrate removes the potential hill, thereby electrons generated in the semiconductor directly beneath the polysilicon electrode at the left side can be transferred to the right side.

Because the smaller the gap between the polysilicon electrodes, the more difficult it is for a potential hill to develop, the gap should be fabricated with a smaller size using a microfabrication technology.

Note that the structure of the substrate may be implemented by means for forming a low concentration p-type silicon layer on a high concentration p-type substrate such as an epitaxial growth technology, for example, or by means for forming the low concentration p-type silicon layer on an n-type substrate, using such as the epitaxial growth technology. Such structure of the substrate is effective in that the component of charges, the charges are generated in a deep region of the semiconductor layer and are extracted slowly through diffusion, can be decreased so as to improve the range-finding resolution.

Figure 3:
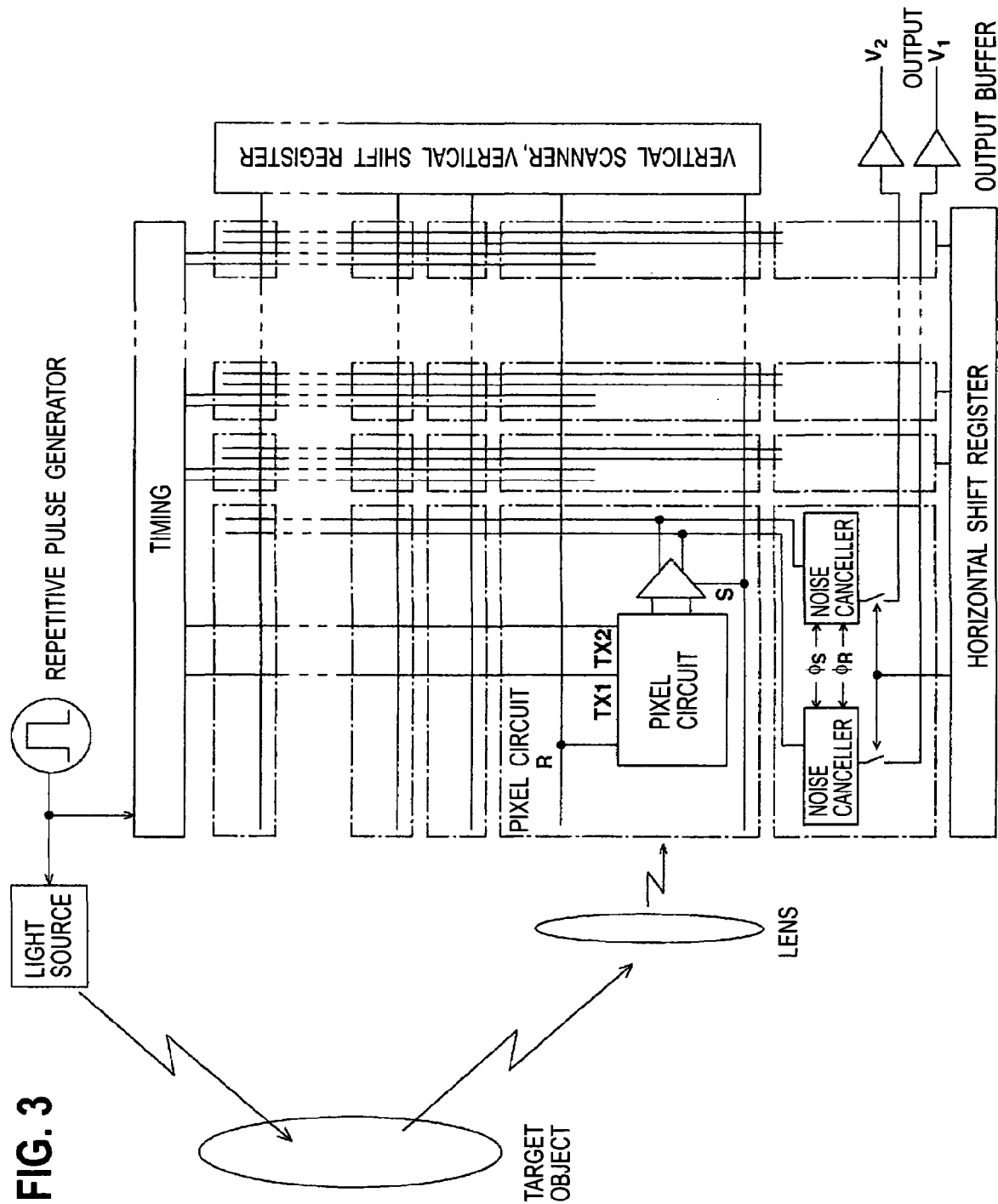
FIG. 3 is a block diagram of a TOF range-finding image sensor.
Figure 4:
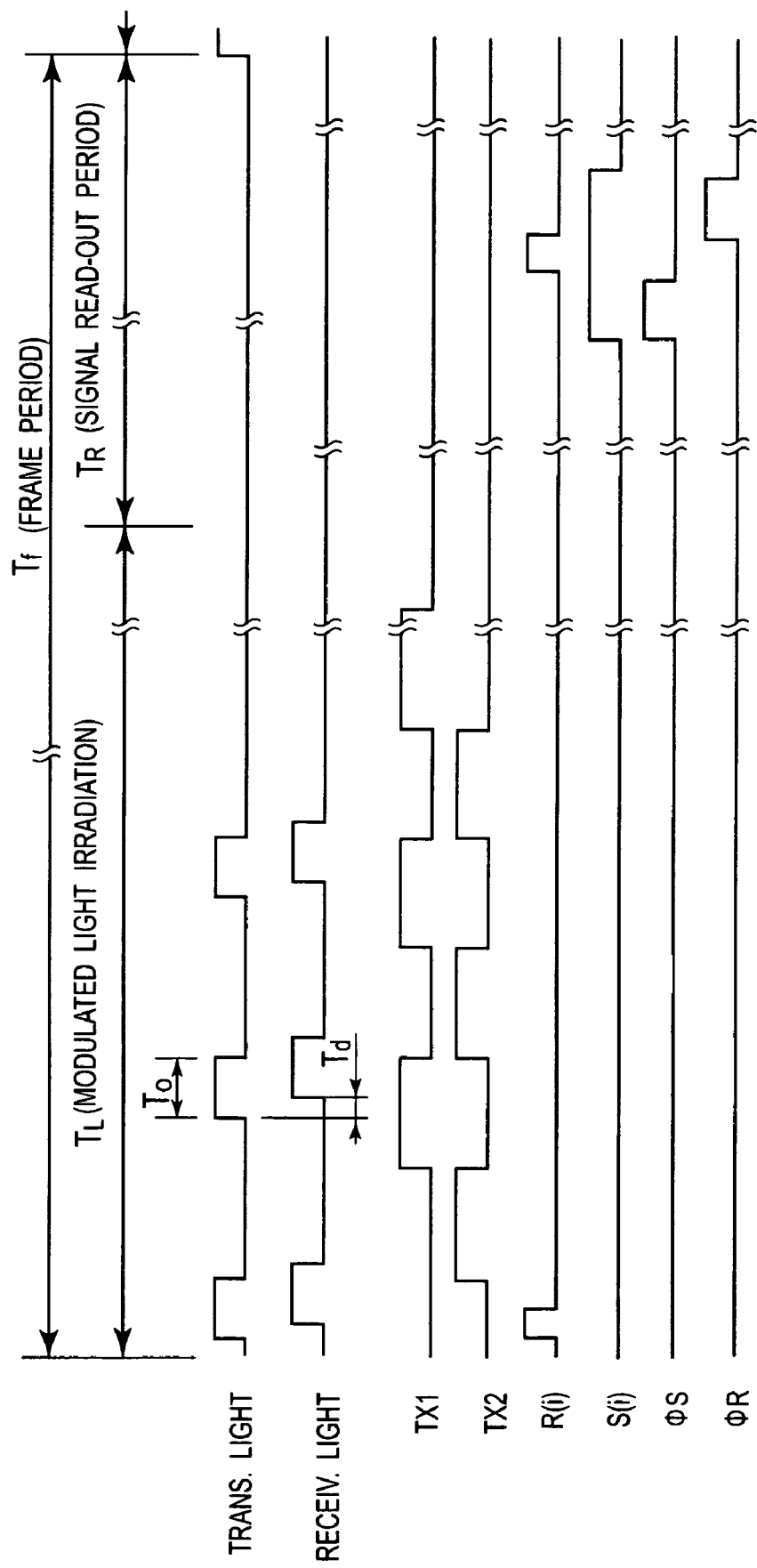
FIG. 4 is a timing chart showing behaviors of the circuit in FIG. 3.

FIG. 3 is a block diagram of a range-finding image sensor made up of two-dimensionally arranged pixel circuits, one of which is shown in FIG. 1. FIG. 4 is a timing chart showing the behavior of the range-finding image sensor.

After high control signals R are applied to two floating diffusion layers for every pixel so as to reset them, a pulsed light source is turn on, and repetitive pulses TX1 and TX2 are applied to all pixels in synchronization with the pulsed light source, thereby operating the pixels for a fixed time period. Afterwards, the pulsed light source is turned off, and the voltages of respective floating diffused layers are then read out. This read-out is conducted by reading out every horizontal line to noise cancellation circuits for respective columns, canceling noise, and then scanning horizontally. Selection of each horizontal line is conducted by providing a control signal S to the pixel selection switch of the buffer amplifier in each pixel, resulting in signals from every horizontal line appearing in vertical signal lines.

A noise cancellation circuit is a circuit configured to cancel the difference between a signal level and a level after resetting the floating diffusion layer, to reduce a fixed noise pattern and 1/f noises generated by buffer amplifiers of respective pixels. Accordingly, as shown in FIG. 4, the noise cancellation circuit is configured to sample a signal level and a level after resetting, in synchronization with $\phi_S$ and $\phi_R$, respectively, and then to calculate the difference between the signal level and the level after resetting. Description of the noise cancellation circuit itself is omitted because the noise cancellation circuit has little relevance to the essence of the present invention.

Charges Q1 and Q2 accumulated in two floating diffusion layers, by applying N times of the TX1 and TX2 so as to transfer N times the resulting charges generated by the applied light pulses into the floating diffusion layers, are respectively represented by the following equations:

$$Q_1 = N \times I_p(T_0 - T_d) \quad (1)$$

$$Q_2 = N \times I_p T_d \quad (2)$$

where Ip denotes a photocurrent generated due to a received light, $T_0$ denotes the width of a light pulse, and $T_d$ denotes the delay time of the light pulse. The sum of the equations (1) and (2) is represented by:

$$Q_1 + Q_2 = N \times I_p T_0 \quad (3)$$

The delay time of the received light and a distance L to a target object are calculated using the following equations according to the equations (1) and (2):

$$T_d = (Q_2/(Q_1+Q_2))T_0 \quad (4)$$

$$L = (c/2)(Q_2/(Q_1+Q_2))T_0 \quad (5)$$

where c denotes the speed of light. Since the voltages of the floating diffusion layers are in proportion to Q1 and Q2, respectively, the equation (5) is represented by the following equation using output signal voltages V1 and V2:

$$L = (c/2)(V_2/(V_1+V_2))T_0 \quad (6)$$

Since c and $T_0$ are known, the distance can be calculated from two received output voltages using the equation (6).

Second Embodiment

The structure of FIG. 2 is easily influenced by a background light (if it exists). That is, according to FIG. 2, even when reading out a signal, charges due to the background light are included in the signal, and furthermore, the times required for reading out the charges due to the background light differ in respective horizontal lines. This makes it difficult to perform background light removal processing. To avoid the difficulty in the background light removal processing, the read-out period needs to be sufficiently short relative to the TOF operating time, and thus high-speed read-out is required.

Figure 5:
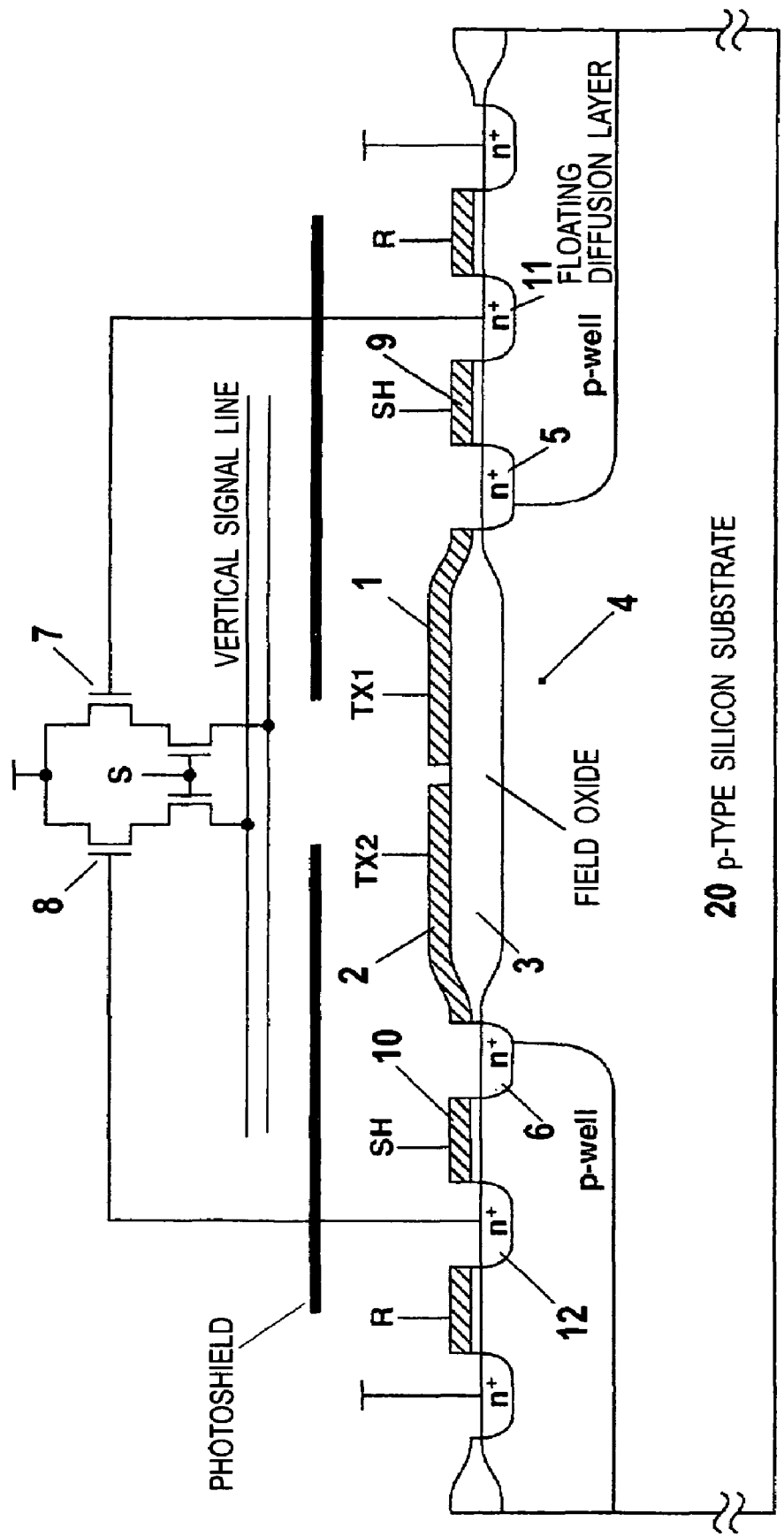
FIG. 5 shows a structure of a pixel circuit having a sample and hold function.
Figure 6:
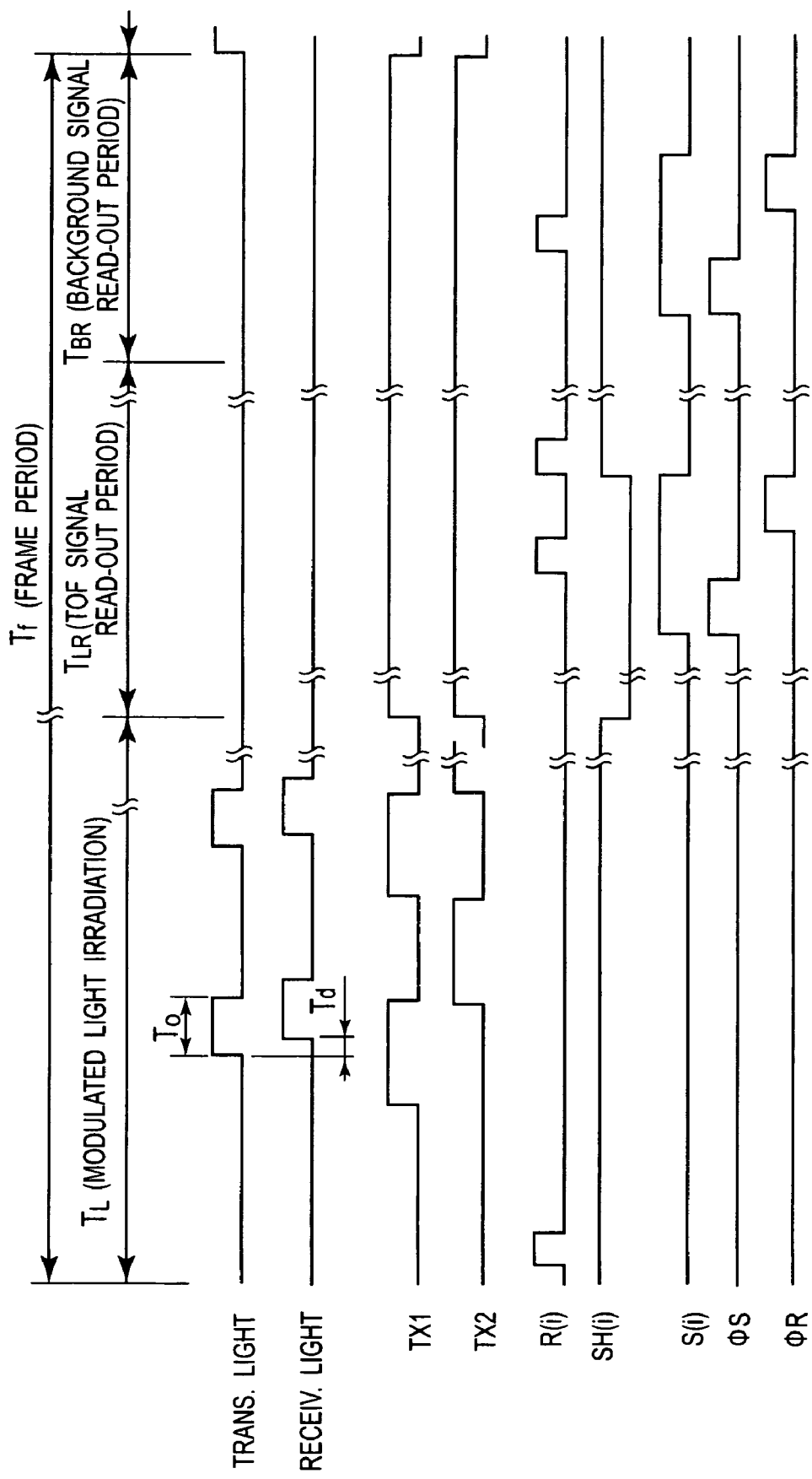
FIG. 6 is a timing chart for a range-finding image sensor using the circuit of FIG. 5, which includes timing for reading out background light.

FIG. 5 shows a structure of a pixel circuit that is not influenced by the background light when reading out a signal. FIG. 6 is a timing chart for canceling the influence of the background light by reading out only signals due to the background light.

MOS transistors (9 and 10) are prepared on the right and the left side, respectively, so as to separate two floating diffusion layers from a photodetector layer, and the gates of the MOS transistors (9 and 10) are controlled by a signal SH. The signal SH is set to a high level during light pulse reception, thereby connecting the two diffusion layers to the photodetector layer. After the reception of the light pulse, the SH is then set to a low level, and thereby separating the two floating diffusion layers from the photodetector layer. At this time, the voltage of the floating diffused layer separated from the photodetector layer is read out, canceling the influence of the charges due to the background light incident on the photodetector layer during the read-out period.

The influence of the background light first needs to be cancelled during reception period of a light pulse under the background light, and then the distance is to be calculated. Therefore, signals for respective pixels generated by the background light are required. It is effective to use as the background signal the charges, which are accumulated during the read-out period of the signal generated by the light pulse. Accordingly, right after reading out the signals generated by the light pulse from the pixels on a subject horizontal line, the floating diffusion layers of the pixels on the subject horizontal line are reset, the accumulation of the background signals is conducted for a fixed time period, and then the same signal read-out operation of the background signals is conducted.

The accumulation period is set to be equal to the entire read-out period of the signals from all of the pixels. To achieve a uniform detection sensitivity, the SH is set to a high level. FIG. 6 shows a timing chart for reading out signals from one of horizontal lines. The reading out operation shown in FIG. 6 is conducted for signals from all horizontal lines. The background light accumulation period for each of the horizontal lines is the same. When the accumulation period during light pulse irradiation ($T_L$) differs from the all-pixel read-out period ($T_{LR}$), consideration of the difference of periods is needed when canceling the background light.

The above-mentioned cancellation of the background light is no problem when a target object is at a standstill. Measurement with a moving target object, however, includes an error because the background signals are taken out for the cancellation process at a different timing during the light pulse irradiation. To decrease the error, a cycle period defined by ($T_L + T_{LR} + T_{BR}$) shown in FIG. 6 is made shorter.

Furthermore, to increase the amount of signals, the operation of the cycle shown in FIG. 6 is repeated, and the resulting signals are integrated in an external circuit. Alternatively, calculation of distance is conducted in every cycle and is repeated multiple times, and an average of the resulting calculated distances is then calculated, thereby simplifying that operation. Moreover, such an average calculation is effective for improving the range-finding resolution.

Note that since the sum of two pixel outputs corresponds to intensity image information of a target object, intensity image information and range image information can be obtained at the same time according to the present invention. The methodology of summing the two pixel outputs facilitates applications such as three-dimensionally displaying an intensity image using a combination of the intensity image information and the range image information.

Third Embodiment

Figure 7:
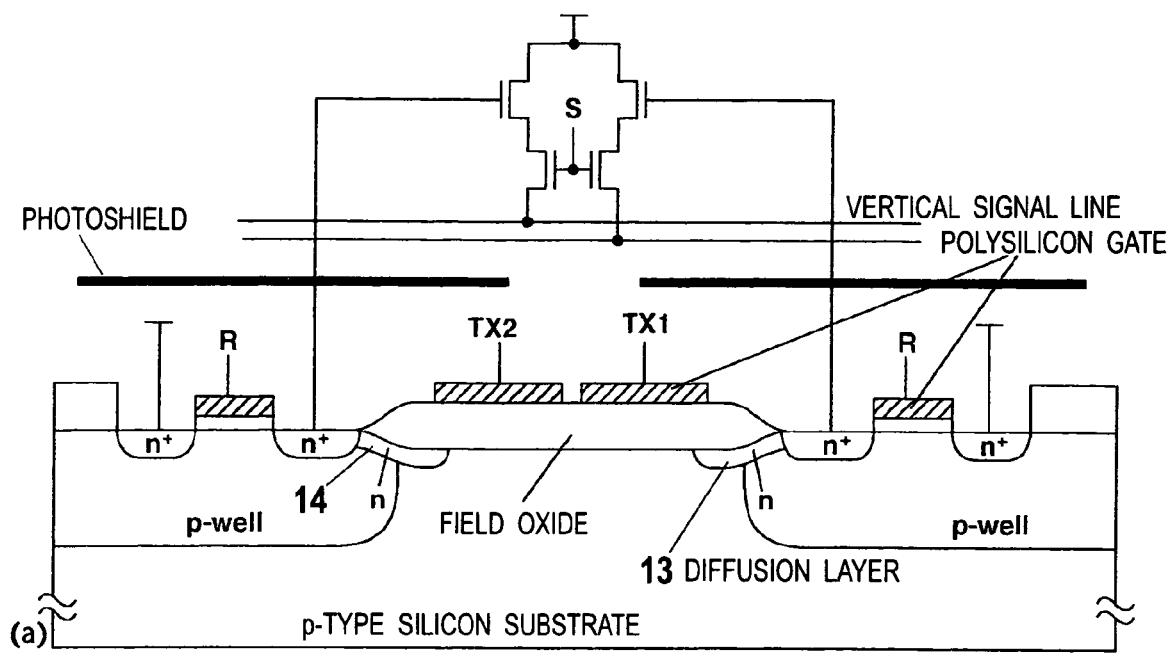
FIG. 7 shows structures using n-type diffusion layers under a field oxide
Figure 7:
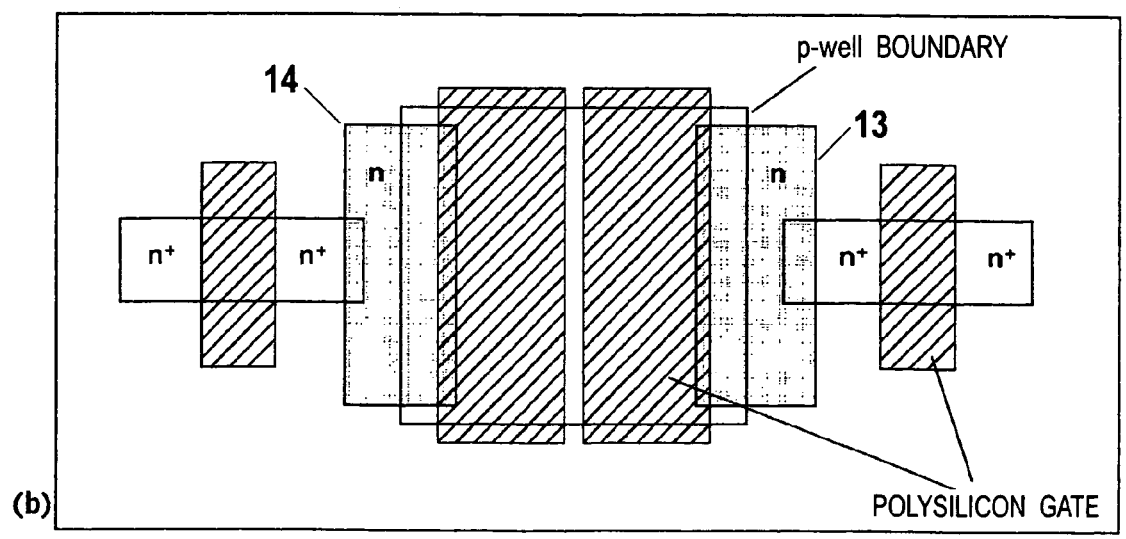

In a structure shown in FIG. 1, if a fabrication process of forming other n-type diffusion layers under the field oxide is available, a structure of connecting the photodetector layer to the floating diffusion layers, which serve as the sources (or drains) of the MOS transistors via the n-type diffusion layers (13 and 14) is possible, as shown in FIG. 7. When a wide (along the depth direction to the plane of the paper) gate width of a photodetector layer is designed so as to ensure a sufficiently large optical detection area, the greater the area of the high-concentration source or drain region of the MOS transistor, the more the dark current increases and the more the capacitance also increases, decreasing the voltage sensitivity. Therefore, as shown in FIG. 7, the n-type diffusion layers are provided so that the n-type diffusion layers can capture electrons generated in the photodetector layer.

Note that an n-type well layer may be used as the n-type diffusion layer being formed under the field oxide.

Fourth Embodiment

Figure 8:
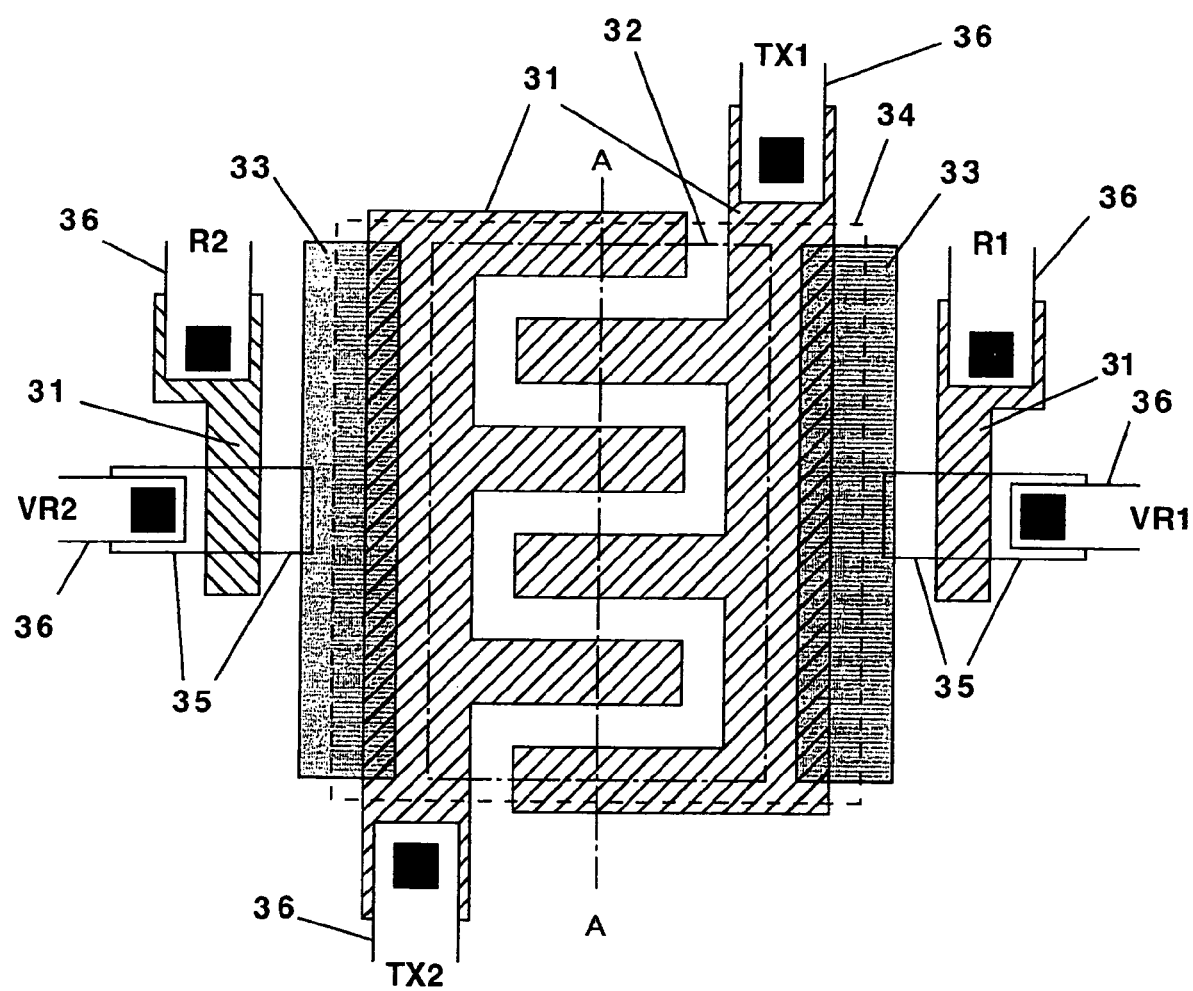
FIG. 8 shows a structure of a TOF pixel using a structure of interdigital electrodes.

FIG. 8 shows a layout of a TOF pixel structure encompassing two comb-shaped photo-gate electrodes arranged interdigitally. In the Figure, reference numerals 31 denote photo-gate electrodes; reference numeral 32 denotes a boundary line indicating that the inside of the boundary line is an aperture into which light enters and the outside is a optically shielded area; reference numerals 33 denote n-type diffusion layers buried under the field oxide; reference numeral 34 denotes a boundary line indicating that the outside of the boundary line is a p-type well region and the inside is a p-type semiconductor substrate; reference numerals 35 denote source or drain regions ($n^+$ diffusion layers) of MOS transistors; and reference numerals 36 denote diffusion layers or metal interconnects configured to be connected with the photo-gate electrodes.

Such an interdigital configuration of the comb-shaped electrodes allows the TOF range-finding sensor to have a high charge-separation capability, when dividing/delivering the charges into two charge-detectors in accordance with the amount of pulse delay, thereby providing a higher range-finding resolution.

Figure 9:
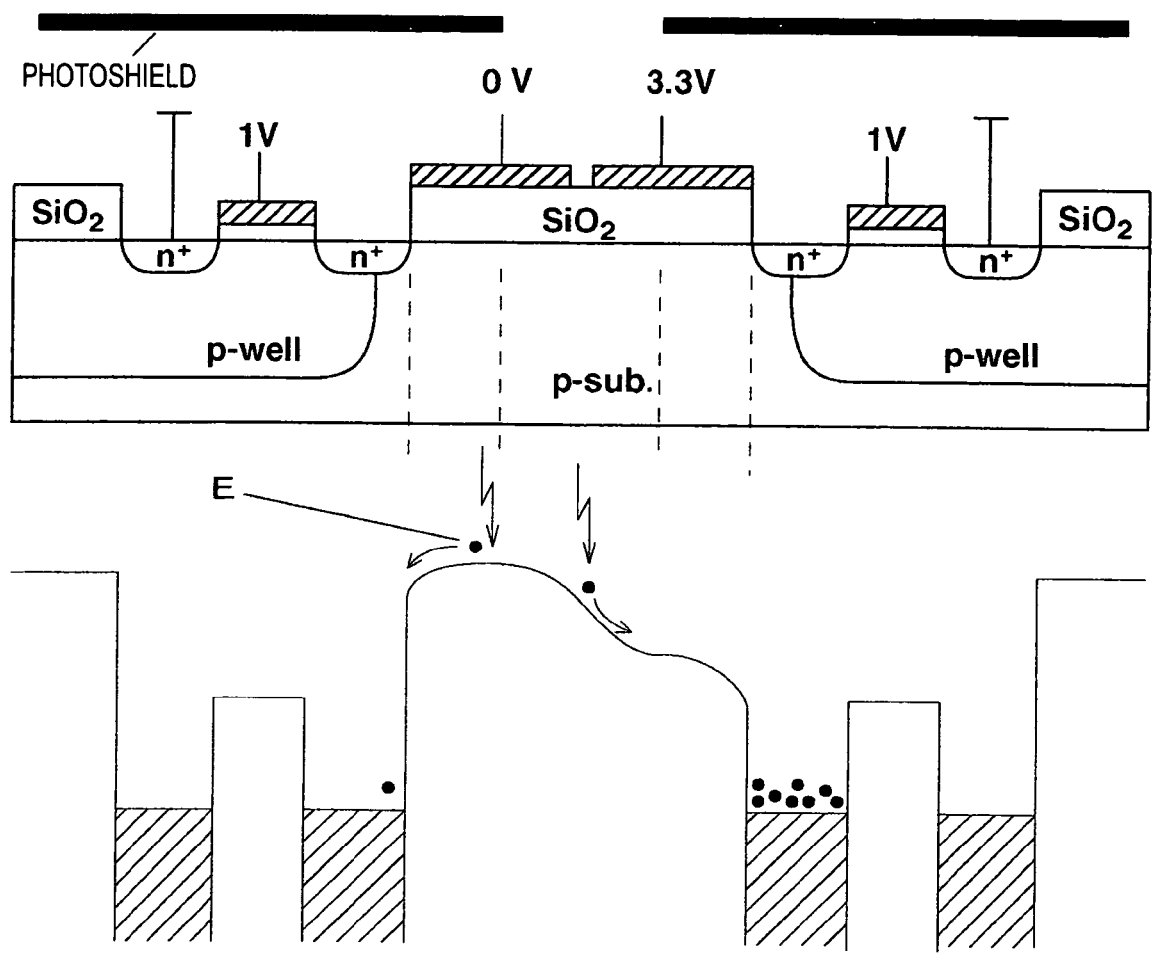
FIG. 9 explains a mixture of signal charges due to leakage of light.

With such a simple structure made from two rectangular photo-gate electrodes facing each other, since a light may leak into a part of the photo shield so as to generate signal charge (E) as shown in FIG. 9, which is fundamentally supposed to be transferred into the charge-detector on the right side; in reality, however, the generate signal charge (E) will be transferred to the charge-detector on the left side. The mal-transfer charge causes a lower separation performance between two signals, lowering the range-finding resolution. To avoid the problem associated with charge-separation capability, the area of the aperture for light to pass through should be decreased so that the light can irradiate only the central region of the pixel. However, the lower aperture ratio lowers the sensitivity.

Figure 10:
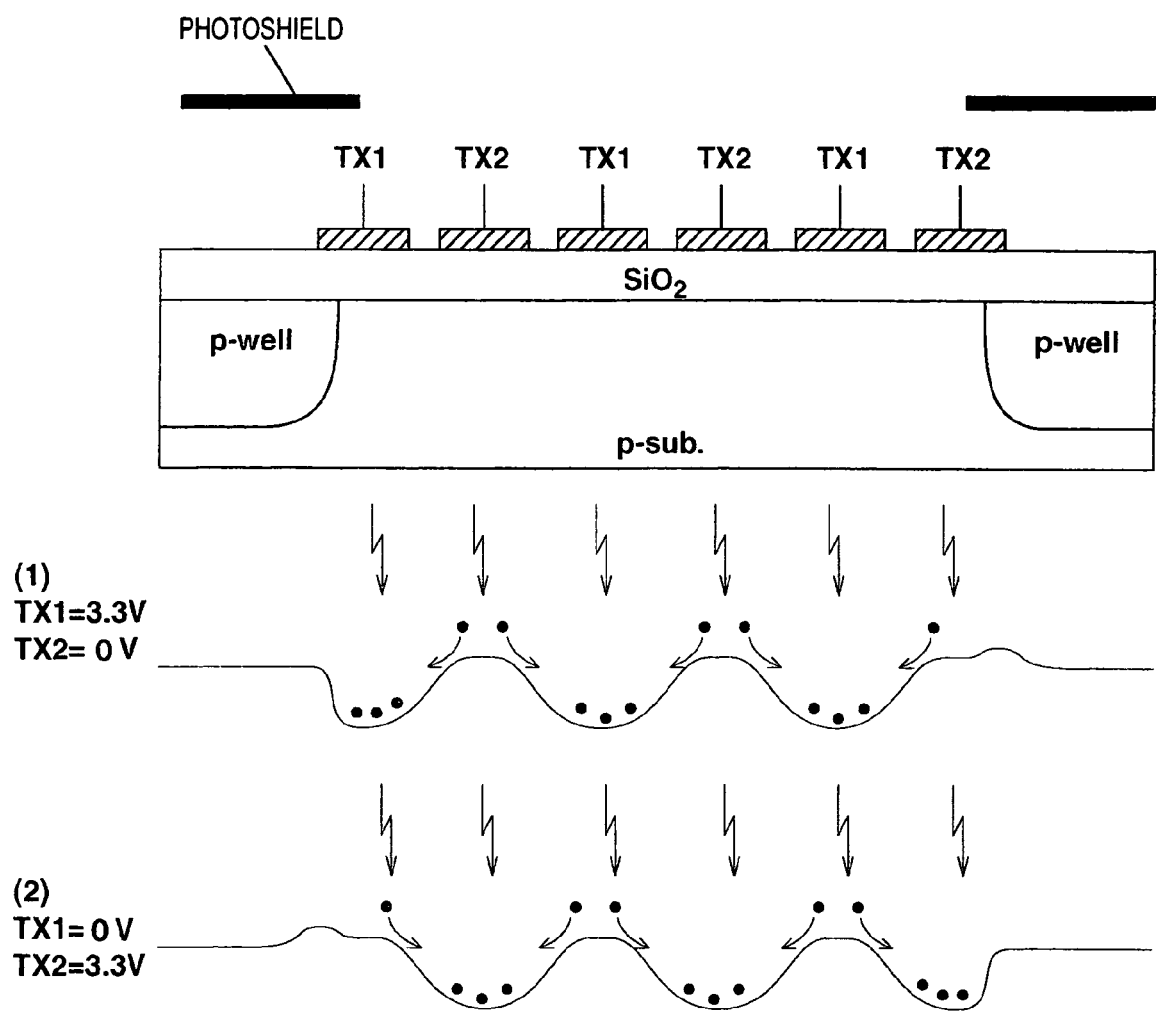
FIG. 10 shows a behavior of the TOF pixel using the structure of the interdigital electrodes.

FIG. 10 shows a surface voltage distribution along the cross-section taken on line A-A in FIG. 8, in the interdigital configuration of the comb-shaped electrodes. With such an interdigital configuration of the comb-shaped electrodes, since the charge-transfer direction is orthogonal to the direction connecting between the two charge-detectors, a high separation capability for charges flowing into two charge-detectors can be achieved, even if the teeth of the interdigital electrodes are lengthened so as to establish a sufficiently large optical aperture. Furthermore, since the width of teeth in the comb-shaped electrodes can be made narrow enough, effective utilization of fringing electric fields is possible, increasing the resolution.

Fifth Embodiment

Figure 11:
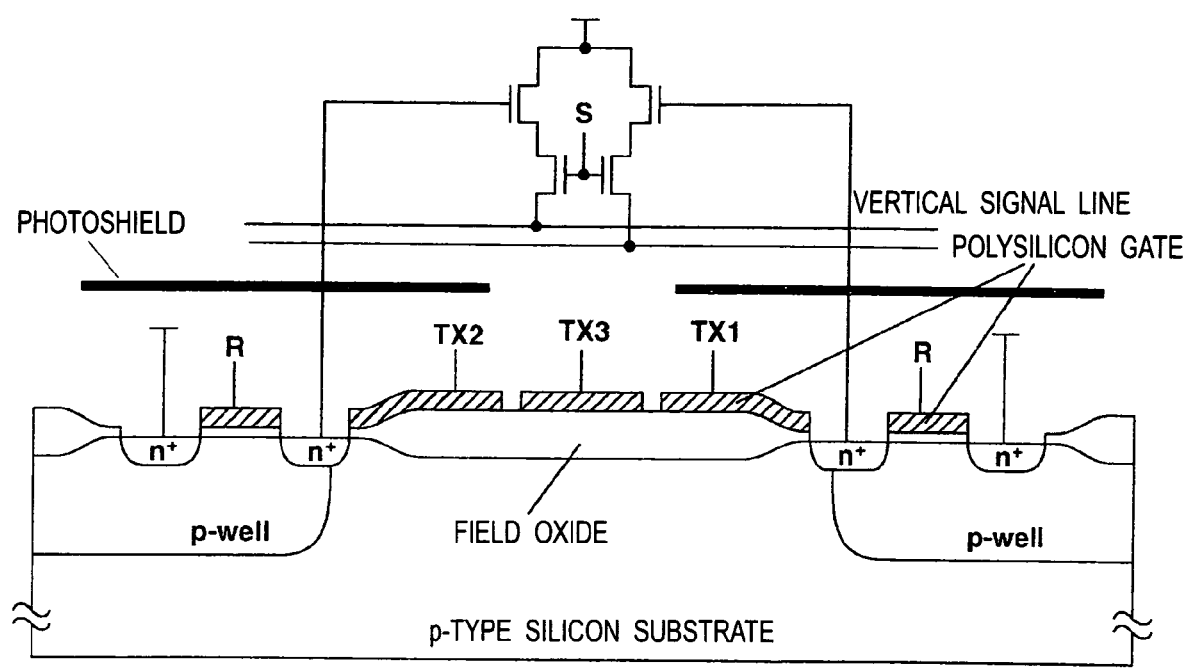
FIG. 11 shows a structure of a TOF sensor including three electrodes.
Figure 12:
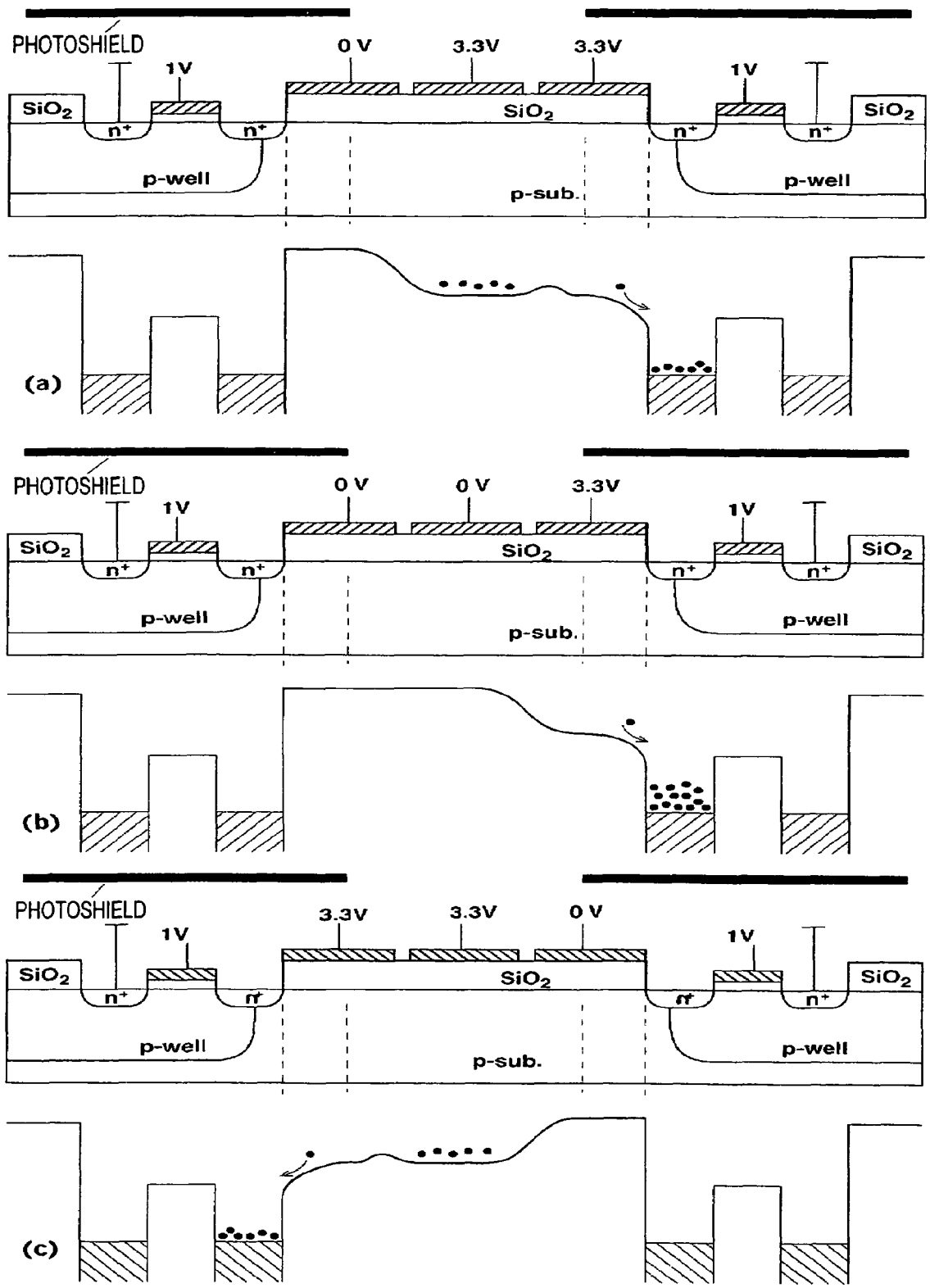
FIG. 12 explains a pixel circuit of FIG. 11.
Figure 13:
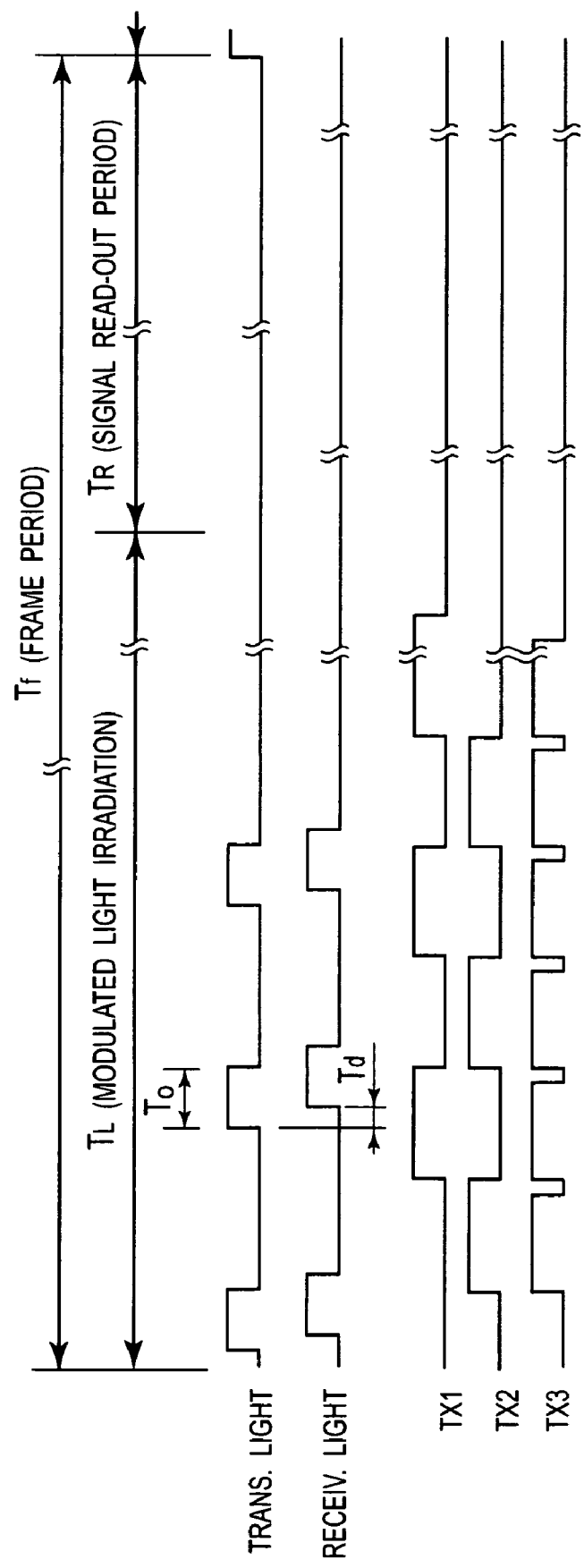
FIG. 13 is a timing chart for control signals in the pixel circuit of FIG. 11.

Furthermore, if the width of the polysilicon electrode is too large, the fringing electric field is made weaker, and thus charge-transfer may be driven insufficiently. Accordingly, three electrodes are prepared as shown in FIG. 11, and a method of providing control signals to three electrodes at timings as shown in FIG. 13 may be used. Behaviors with three electrodes are shown in FIG. 12. For transferring the signal to the floating diffusion layer on the right side, high positive voltages are applied to the TX1 and TX3, respectively, TX3 is a control voltage for the central electrode, and 0V is applied to the TX2 (FIG. 12(a)). As a result, the charges stored beneath the TX1 electrode are transferred to the floating diffusion layer on the right side while charges under the TX3 electrode are temporarily stored beneath the TX3 electrode.

Just before changing the charge-transfer direction to the left side, the TX3 is changed to be 0V for a short period, thereby transferring the charges beneath the TX3 electrode to the right side (FIG. 12(b)). Afterwards, the TX1 is changed to be 0V while positive voltages are applied to the TX2 and the TX3, respectively, thereby changing the charge-transfer direction to the left side (FIG. 12(c)). Not shown in FIG. 13, the TX3 is changed to be 0V for a short period just before changing the charge-transfer direction to the right side, thereby transferring the charges beneath the TX3 electrode to the left side. These operations are repeated. Through these operations, sufficient fringing electric fields are utilized to transfer charges at a high speed while ensuring a sufficient optical detection area.

To generate a two-dimensional image with a single photo-detector layer, an optical beam scanning means such as a rotating polygon mirror or a vibrating mirror, which scans incident beams from a two-dimensional surface, may be employed. Alternatively, a combination of a range-finding sensor made from linearly arranged photo-detector layers and a similar optical beam scanning means may also provide a two-dimensional image.

INDUSTRIAL APPLICABILITY

Figure 14:
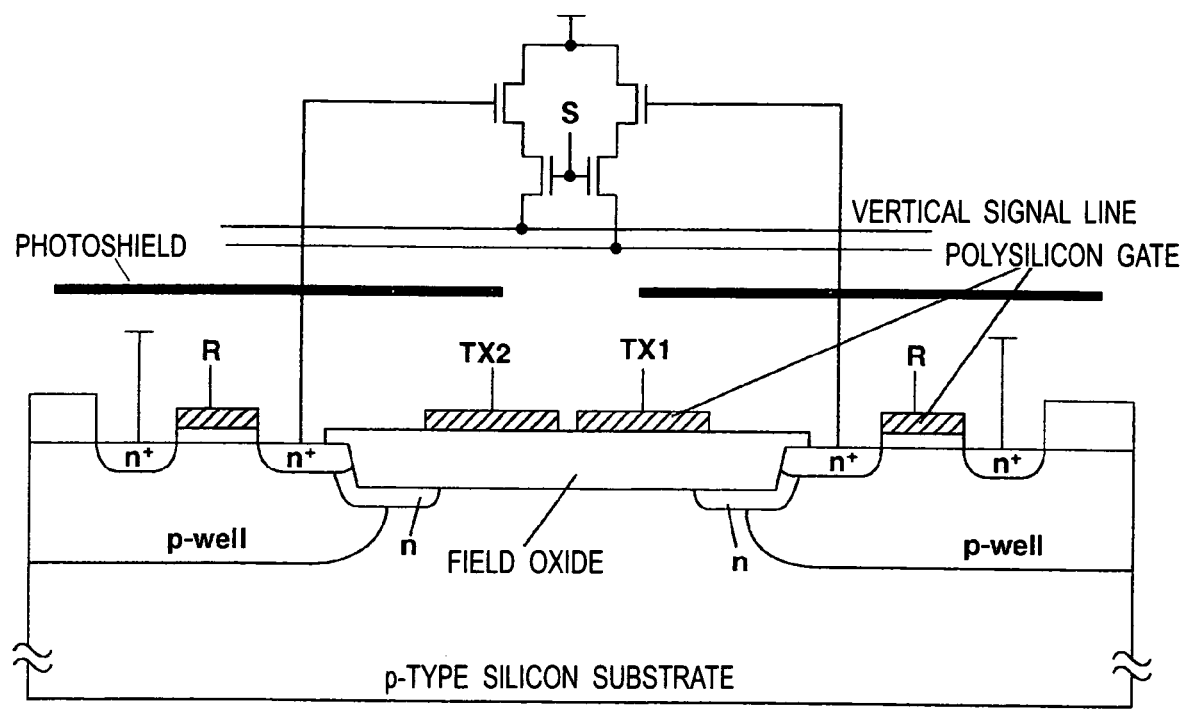
FIG. 14 shows a pixel structure of a TOF sensor using a field oxide established by STI architecture.

The diagrams of the structures demonstrated thus far assume that the structure of the actual field oxide is implemented by a local oxidation of silicon (LOCOS) method. Alternatively, the field oxide may be implemented by a shallow trench isolation (STI) method. FIG. 14 shows an exemplary structure that is the same as that of FIG. 7 and is manufactured by a CMOS image sensor fabrication process with the STI.

In the same manner, the structures shown in FIGS. 1, 5, and 8 can be substituted by the STI structure.

The structures and ideas according to the present invention can be applied to all structures used in CMOS LSIs or CMOS image sensors, in addition to these cases without losing generality. That is, a structure embracing two adjacent light transmissive electrodes (generally made of polysilicon), which serve as optical-receiving portions formed on a field oxide, and two n-type-regions serving as two floating diffusion layers, respectively, shall be employed so that charges can be transferred to the floating diffusion layers.

The invention claimed is:

1. A time-of-flight range-finding sensor for range-finding by reading a signal, which depends on a delay time of repetitive light pluses transmitted from a light source and then reflected by a target object to be measured, the time-of-flight range-finding sensor comprising:
    a p-type semiconductor substrate having a p-type photo-detector layer and a p-type well formed at a surface of the semiconductor substrate so as to encircle the photo-detector layer in a plan view, the p-type well having a higher concentration than the semiconductor substrate;
    an insulator layer formed on the photodetector layer;
    two conductive photo-gate electrodes provided on the insulator layer above the photodetector layer, adjacently disposed so as to define a gap between the two photo-gate electrodes, and being transparent for a wavelength of a light reflected by the target object; and
    two MOS transistors formed in the p-type well so as to sandwich the photo-gate electrodes, each of the MOS transistors having an n-type floating diffusion layer serving as a source region, which is disposed at a boundary between the photodetector layer and the p-type well and configured to extract charges from the photodetector layer, wherein a uniform optical path exists along the full-width of the gap.

2. The time-of-flight range-finding sensor according to claim 1, wherein each of two photo-gate electrodes has a comb-shaped geometry having a plurality of projections in a plan view, the projections of one of the photo-gate electrodes are inserted interdigitally between the projections of the other photo-gate electrode.

3. The time-of-flight range-finding sensor according to claim 1, further comprising signal-extraction MOS transistors, wherein each of the two MOS transistors further comprises:

- a second floating diffusion layer serving as a drain, being connected to a gate electrode of one of the signal-extraction MOS transistors; and
- a gate electrode to be applied with gate voltage, being controlled so as to electrically separate the first floating diffusion layer from the second floating diffusion layer configured to allow storage of an analog signal.

4. The time-of-flight range-finding sensor according to claim 1, wherein the insulator layer utilizes a field oxide being formed in a manufacturing procedure of a CMOS integrated circuit.

5. The time-of-flight range-finding sensor according to claim 1, further comprising two diffusion layers provided under the insulator layer, between the photodetector layer and the n-type floating diffusion layers, being doped with impurity atoms having the same polarity as impurity atoms of the n-type floating diffusion layers.

6. The time-of-flight range-finding sensor according to claim 1, wherein the photo-gate electrodes are made of polysilicon, which is the same material as the gate electrode of a MOS transistor in a CMOS integrated circuit, or polysilicon and silicide formed on the polysilicon, the silicide being treated so as to increase optical transmissivity.

7. The time-of-flight range-finding sensor according to claim 1, wherein the photodetector layer utilizes the p-type semiconductor substrate, such that both a p-type well and an n-type well are not formed in the photodetector layer.

8. The time-of-flight range-finding sensor according to claim 1, wherein the photodetector layer utilizes a low concentration n-type semiconductor substrate, such that both a p-type well and an n-type well are not formed in the photodetector layer.

9. The time-of-flight range-finding sensor according to claim 1, wherein a plurality of unit structures, each of which comprising the photo-gate electrodes, the photodetector layer, and the n-type floating diffusion layers, are arranged one-dimensionally or two-dimensionally so as to generate an image representing a range distribution.

10. The time-of-flight range-finding sensor according to claim 1, further comprising a light beam scanner configured to generate incident beams into the range-finding sensor from a two-dimensional plane so as to generate an image representing a range distribution.

11. The time-of-flight range-finding sensor according to claim 1, wherein range information is obtained from the ratio of two signals taken out respectively from the photo-gate electrodes, while intensity information is obtained from the sum of the two signals.

* * * * *